US009082788B2

(12) United States Patent
Loubet et al.

(10) Patent No.: US 9,082,788 B2
(45) Date of Patent: Jul. 14, 2015

(54) METHOD OF MAKING A SEMICONDUCTOR DEVICE INCLUDING AN ALL AROUND GATE

(71) Applicants: STMICROELECTRONICS, INC., Coppell, TX (US); INTERNATIONAL BUSINESS MACHINES CORPORATION, Armonk, NY (US)

(72) Inventors: Nicolas Loubet, Guilderland, NY (US); Prasanna Khare, Schenectady, NY (US); Huiming Bu, Glenmont, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 62 days.

(21) Appl. No.: 13/906,702

(22) Filed: May 31, 2013

(65) Prior Publication Data

US 2014/0357036 A1    Dec. 4, 2014

(51) Int. Cl.
| | |
|---|---|
| H01L 21/8238 | (2006.01) |
| H01L 29/66 | (2006.01) |
| H01L 21/8234 | (2006.01) |
| H01L 27/12 | (2006.01) |
| H01L 29/78 | (2006.01) |

(52) U.S. Cl.
CPC .. *H01L 29/66484* (2013.01); *H01L 21/823481* (2013.01); *H01L 27/1211* (2013.01); *H01L 29/6681* (2013.01); *H01L 29/66545* (2013.01); *H01L 29/785* (2013.01)

(58) Field of Classification Search
USPC .................................................. 438/212, 424
See application file for complete search history.

(56) References Cited

U.S. PATENT DOCUMENTS

| | | |
|---|---|---|
| 7,268,058 B2 | 9/2007 | Chau et al. |
| 7,288,802 B2 | 10/2007 | Anderson et al. |
| 8,110,458 B2 | 2/2012 | Jin et al. |
| 8,310,013 B2 | 11/2012 | Lin et al. |
| 8,445,334 B1 | 5/2013 | Basker et al. |
| 2004/0036127 A1 | 2/2004 | Chau et al. |
| 2006/0024874 A1 | 2/2006 | Yun et al. |
| 2008/0135949 A1 | 6/2008 | Lo et al. |
| 2008/0169472 A1 | 7/2008 | Bryant et al. |
| 2008/0265280 A1 | 10/2008 | Currie |
| 2012/0138886 A1 | 6/2012 | Kuhn et al. |
| 2012/0146112 A1 | 6/2012 | Cheng et al. |
| 2012/0252174 A1 | 10/2012 | Dutartre et al. |
| 2013/0052801 A1 | 2/2013 | Berliner et al. |
| 2013/0341704 A1* | 12/2013 | Rachmady et al. ........... 257/327 |

* cited by examiner

*Primary Examiner* — Reema Patel
(74) *Attorney, Agent, or Firm* — Allen, Dyer, Doppelt, Milbrath & Gilchrist, P.A.

(57) ABSTRACT

A method of making a semiconductor device includes forming an intermediate structure including second semiconductor fin portions above a first semiconductor layer, and top first semiconductor fin portions extending from respective ones of the second semiconductor fin portions. The second semiconductor fin portions are selectively etchable with respect to the top first semiconductor fin portions. A dummy gate is on the intermediate structure. The second semiconductor fin portions are selectively etched to define bottom openings under respective ones of the top first semiconductor fin portions. The bottom openings are filled with a dielectric material.

21 Claims, 8 Drawing Sheets

METHOD OF MAKING A SEMICONDUCTOR DEVICE INCLUDING AN ALL AROUND GATE

FIELD OF THE INVENTION

The present invention relates to a method of making electronic devices, and more particularly, to a method of making semiconductor devices.

BACKGROUND

Semiconductor device technologies continue to evolve, providing higher chip density and operating frequencies. Fin-type field-effect transistors (FinFETs) are one type of transistor technology that is currently used to help provide desired device scaling while maintaining appropriate power consumption budgets.

A fin-type field effect transistor is a transistor that is formed with a fin of material. A fin is a relatively narrow width and relatively tall height structure that protrudes from the top surface of a semiconductor layer. The fin width is intentionally kept small to limit the short channel effect.

In a conventional FinFET, a gate conductor is positioned on the top surface of the semiconductor layer and over a portion of the fin. The gate conductor runs parallel to the top of the semiconductor layer and is perpendicular to the fin length that the gate conductor intersects a portion of the fin. An insulator e.g., gate oxide) separates the gate conductor from the fin. Further, the region of the fin that is positioned below the gate conductor defines a semiconductor channel region. The FinFET structure can include multiple fins, in which case the gate conductor would wrap around, as well as fill in, the space between these fins. When the gate surrounds all sides of the fins, the resulting FinFET structure includes an all around gate and is commonly referred to as a nano-wire device.

When forming a FinFET structure or semiconductor device that includes an all around gate, a silicon on insulator (SOI) substrate is typically used. U.S. published patent application no. 2012/0138886, for example, discloses silicon and silicon germanium nano-wire devices. To form the nano-wire device, alternating layers of epitaxial silicon are formed on epitaxial silicon germanium on a SOI substrate, the alternating layers are patterned to form fin structures, and spacers are formed across and on the fin structures. A portion of the fin structures from source/drain regions on the substrate is removed. Source/drain structures are formed on the source/drain regions, wherein the source/drain regions are adjacent the spacers. One of the silicon and the epitaxial silicon germanium layers is removed from the fin structures disposed between the spacers.

As another example, U.S. published patent application no. 2008/013949 discloses a method of forming a stacked silicon-germanium nano-wire device on an SOI support substrate. The method includes forming a stacked structure on the SOI support substrate, with the stacked structure comprising at least one channel layer and at least one interchannel layer deposited on the channel layer. A fin structure is formed from the stacked structure. The fin structure includes at least two supporting portions and a fin portion arranged therebetween. The method further includes oxidizing the fin portion of the fin structure thereby forming the silicon-germanium nano-wire being surrounded by a layer of oxide, and removing the layer of oxide to form the silicon-germanium nano-wire. Nonetheless, there is still a need for other approaches to form semiconductor devices with all around gates.

SUMMARY

A method of making a semiconductor device includes forming an intermediate structure comprising a plurality of second semiconductor fin portions above a first semiconductor layer, and a plurality of top first semiconductor fin portions extending from respective ones of the plurality of second semiconductor fin portions. The plurality of second semiconductor fin portions may be selectively etchable with respect to the plurality of top first semiconductor fin portions. A dummy gate may be on the plurality of top first semiconductor fin portions and the first semiconductor layer.

The method may further comprise selectively etching the second semiconductor fin portions to define bottom openings under respective ones of the plurality of top first semiconductor fin portions, and filling the plurality of bottom openings with a dielectric material.

The first semiconductor layer may comprise a first semiconductor bulk wafer and a plurality of bottom first semiconductor fin portions thereon. The semiconductor device is advantageously formed using a bulk wafer, which is less costly than using a silicon on insulator (SOT) structure.

The first semiconductor layer may comprise silicon, the second semiconductor fin portions may comprise silicon germanium, and the first semiconductor fin portions may comprise silicon, for example. The second semiconductor fin portions may be characterized as sacrificial fin portions since they are replaced with the dielectric material, which may be an oxide, for example.

Forming the intermediate structure may further comprise forming an intermediate dielectric layer on the first semiconductor layer, with an upper surface thereof being adjacent the second semiconductor fin portions.

The method may further comprise forming source and drain regions adjacent the dummy gate. The source and drain regions may comprise raised source and drain regions.

The dummy gate may comprise an oxide layer and a polysilicon layer thereover. The method may further comprise removing the polysilicon layer, and selectively removing the oxide layer from the dummy gate and a portion of the dielectric material in the bottom openings so that all sides of the top first semiconductor fin portions are exposed. A gate may then be formed around each respective top first semiconductor fin portion. Since the gate surrounds all sides of the top first semiconductor fin portions, the resulting semiconductor device includes an all around gate and is commonly referred to as a nano-wire device.

DETAILED DESCRIPTION OF THE PREFERRED EMBODIMENTS

The present embodiments will now be described more fully hereinafter with reference to the accompanying drawings, in which preferred embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

Figure 1:
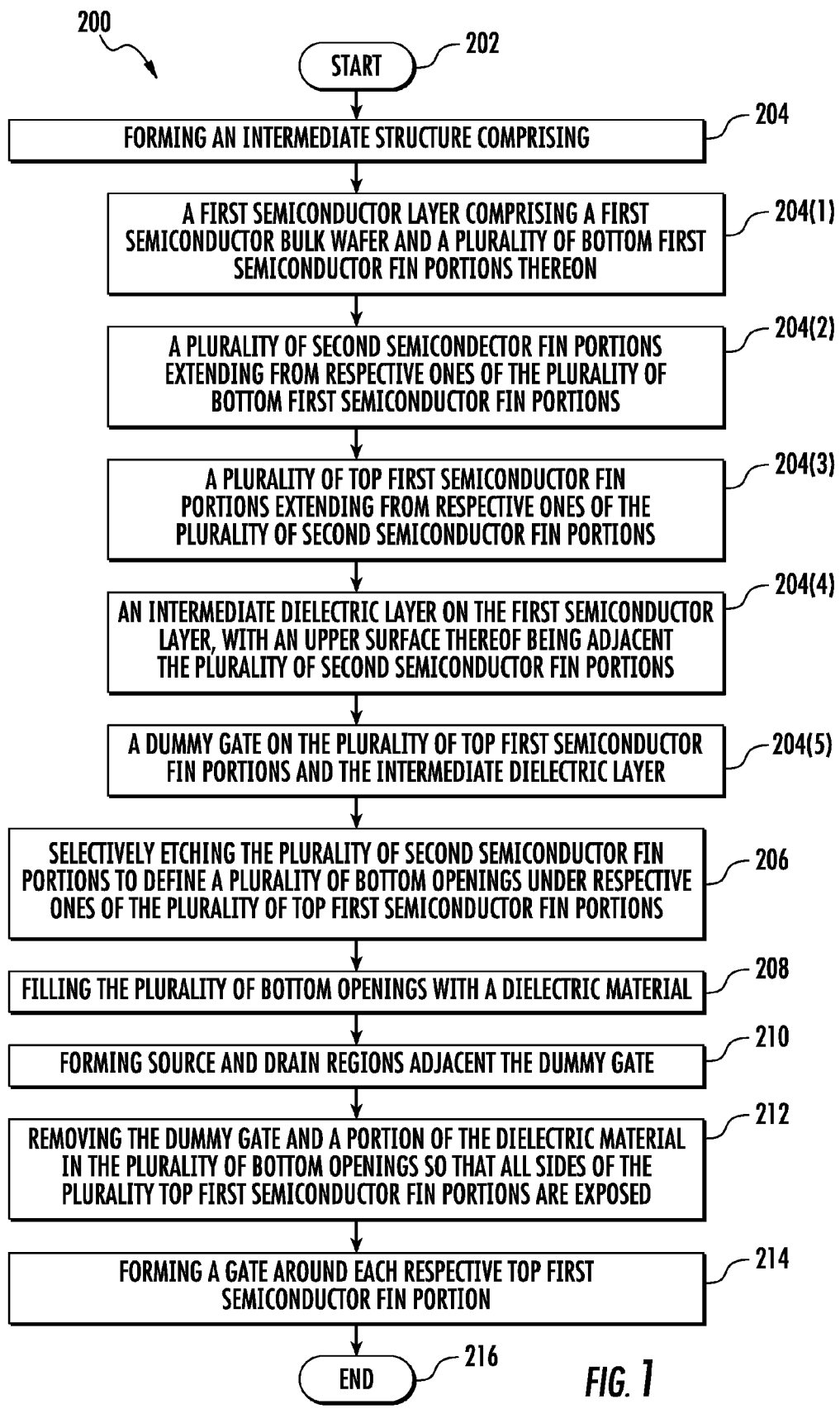
FIG. 1 is a flowchart illustrating a method for making a semiconductor device in accordance with the present embodiment.
Figure 2:
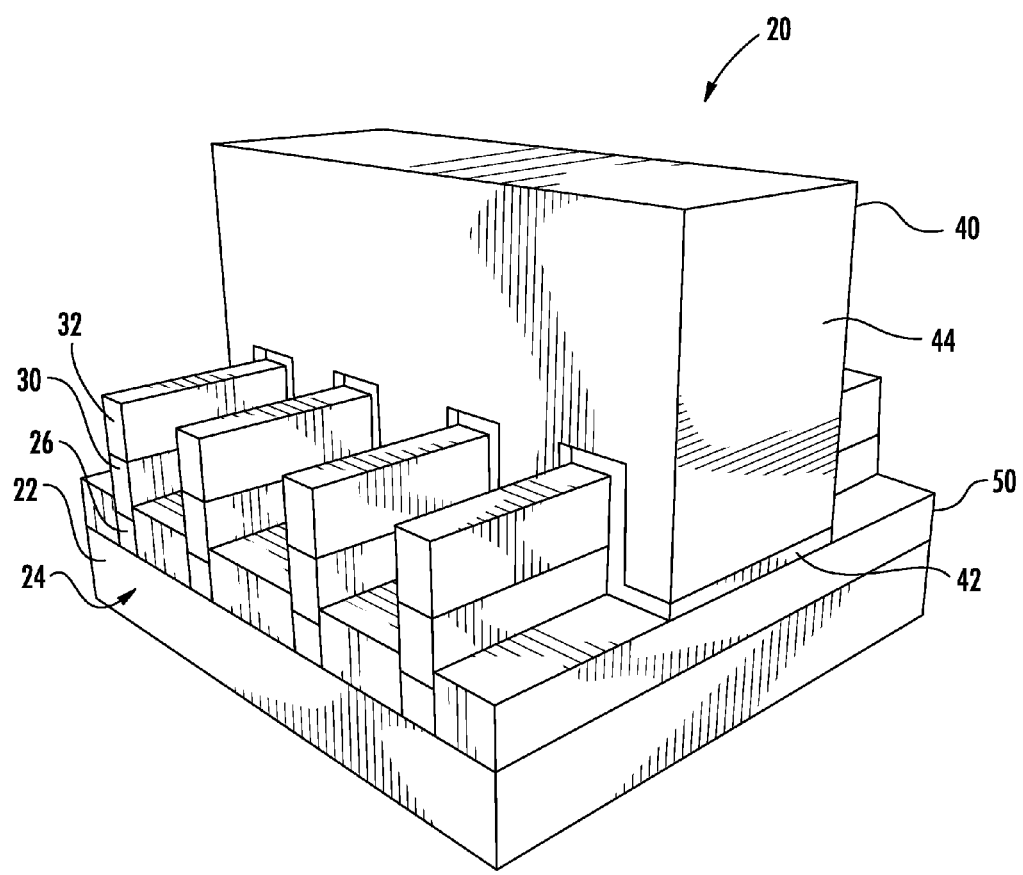
FIG. 2 is a side perspective view of an intermediate structure with the first and second semiconductor fin portions extending outwardly from the dummy gate in accordance with the present embodiment.
Figure 3:
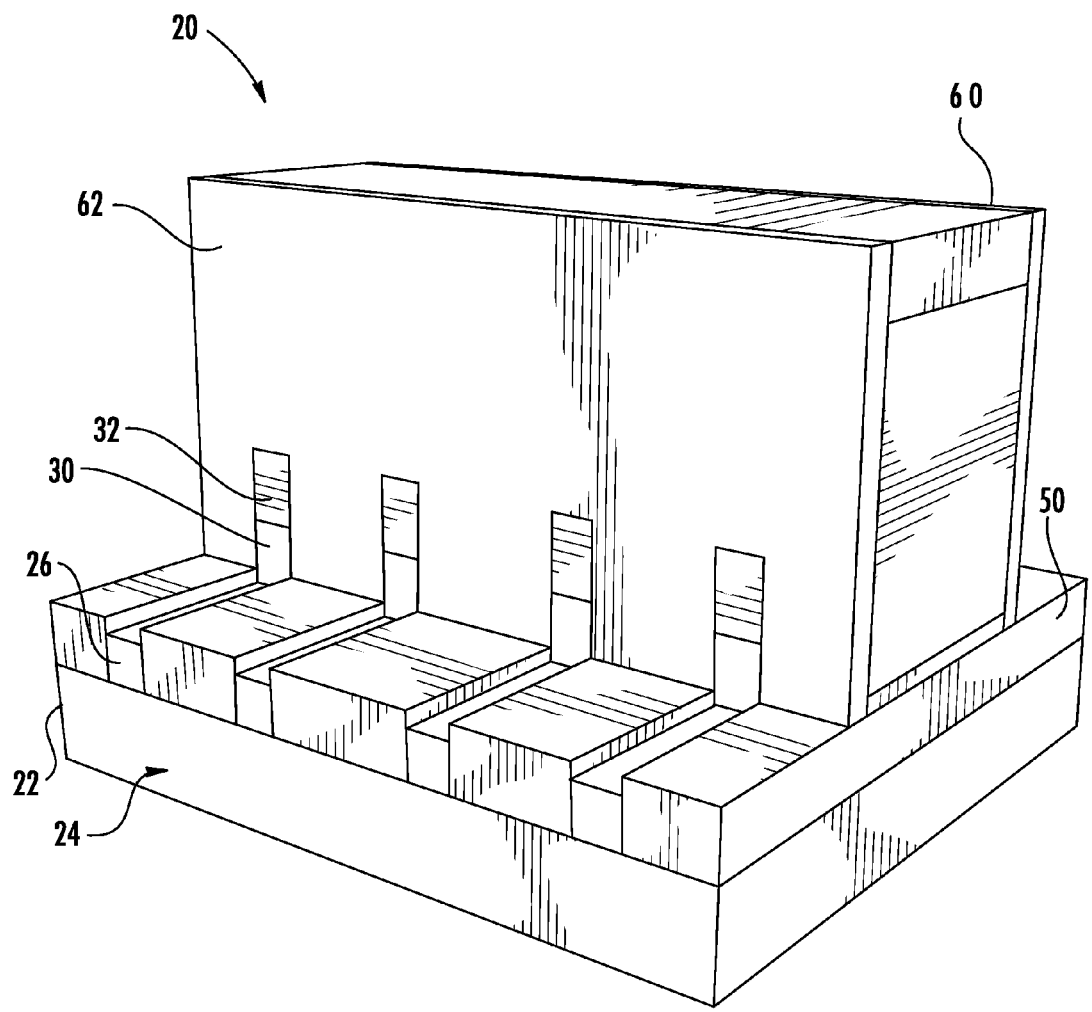
FIG. 3 is a side perspective view of the intermediate structure illustrated in FIG. 2 without the first and second semiconductor fin portions extending outwardly from the dummy gate removed.

Referring initially to the flowchart 200 in FIG. 1 and to the process flow illustrated in FIGS. 2 and 3, the method includes, from the start (Block 202), forming an intermediate structure 20 at Block 204. The intermediate structure 20 is advantageously formed as a bulk wafer, which is less costly than using a silicon on insulator (SOI) structure.

A specific series of process flows providing the intermediate structure 20 will not be discussed since they are readily understood by those skilled in the art. In fact, multiple ways may be used to form the illustrated intermediate structure 20. Commonality between the different process flows is that a silicon on insulator (SOI) structure is not needed. Instead, a bulk wafer is used wherein epitaxy may be used to grow the fins. As will be explained in greater detail below, epitaxially grown fins include top first semiconductor fin portions and underlying second semiconductor fin portions, wherein the second semiconductor fin portions are selectively removed and replaced with a dielectric material. Since the gate surrounds all sides of the top first semiconductor fin portions, the resulting semiconductor device includes an all around gate and is commonly referred to as a nano-wire device.

As illustrated in FIG. 2, the intermediate structure 20 is formed to include a first semiconductor layer 22 comprising a first semiconductor bulk wafer 24 and a plurality of bottom first semiconductor fin portions 26 thereon at Block 204(1). A plurality of second semiconductor fin portions 30 extends from respective ones of the plurality of bottom first semiconductor fin portions 26 at Block 204(2). A plurality of top first semiconductor fin portions 32 extends from respective ones of the second semiconductor fin portions 30 at Block 204(3). An intermediate dielectric layer 50 is on the first semiconductor layer 22, with an upper surface thereof being adjacent the second semiconductor fin portions 30 at Block 204(4). A dummy gate 40 is on the plurality of top first semiconductor fin portions 32 and the intermediate dielectric layer 50 at Block 204(5).

The dummy gate 40 includes an oxide layer 42 and a polysilicon layer 44 thereover. In the illustrated example, the first semiconductor layer 22 is silicon, the second semiconductor fin portions 30 are silicon germanium, and the top first semiconductor fin portions 32 are silicon. Depending on the intended application, other materials may be used.

The first and second semiconductor fin portions 30, 32 initially extend outwardly from the dummy gate 40, as illustrated in FIG. 2. Similarly, the intermediate dielectric layer 50 also extends outwardly from the dummy gate 40.

A dummy gate hard mask 60 is formed on the polysilicon 42 and sidewall spacers 62 are formed on opposite sides of the polysilicon. The dummy gate hard mask 60 and the sidewall spacers 62 are silicon nitride, for example. This allows the dummy gate 40 to be protected during a reactive ion etching (RIB) process. An RIE process is used to remove the first and second semiconductor fin portions 30, 32 that extend outwardly from the dummy gate 40, as illustrated in FIG. 3. This is where the source and drain regions are to be formed.

Figure 4:
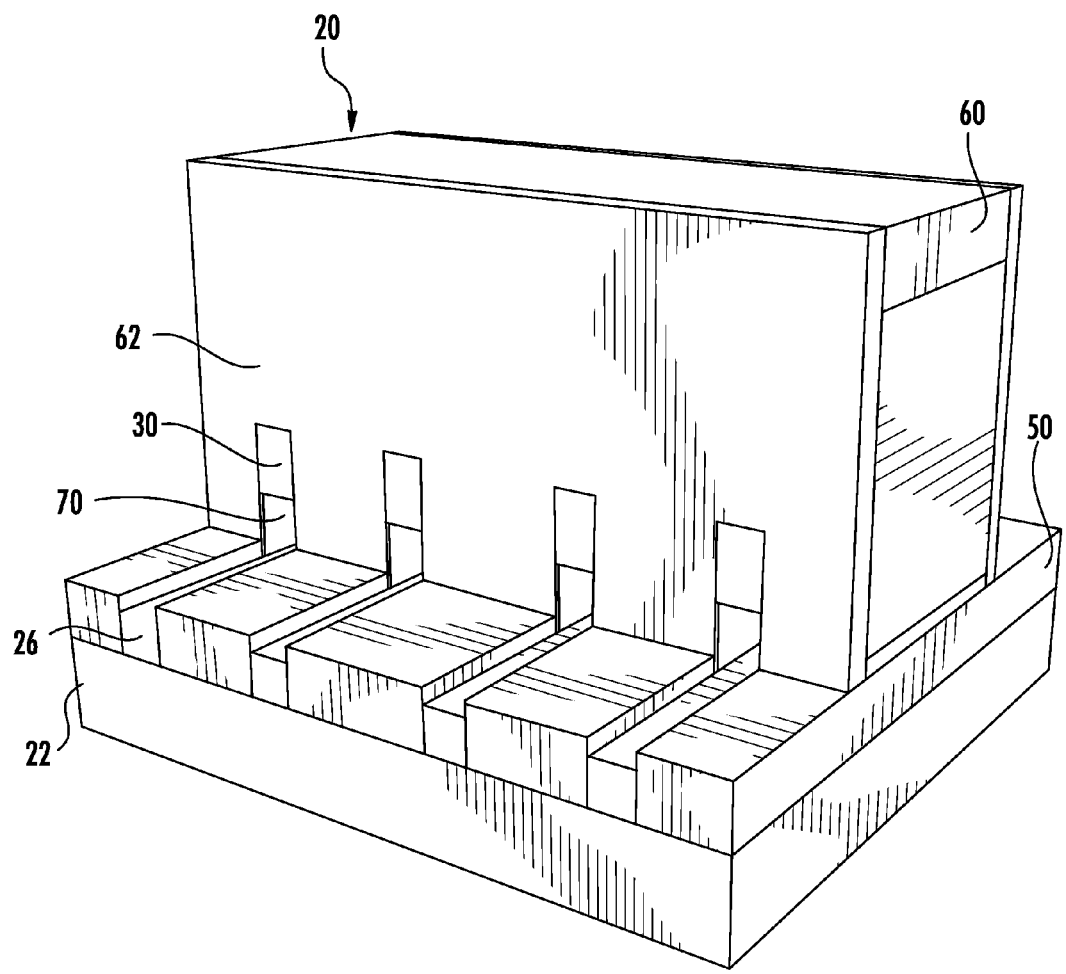
FIG. 4 is a side perspective view of the intermediate structure illustrated in FIG. 3 with the second semiconductor fin portions removed to define bottom openings under the top first semiconductor fin portions.

At Block 206 and as illustrated in FIG. 4, the second semiconductor fin portions 30 are selectively etched to define a plurality of bottom openings 70 under respective ones of the plurality of top first semiconductor fin portions 32. Each bottom opening 70 extends completely under a respective top first semiconductor fin portion 32.

Figure 5:
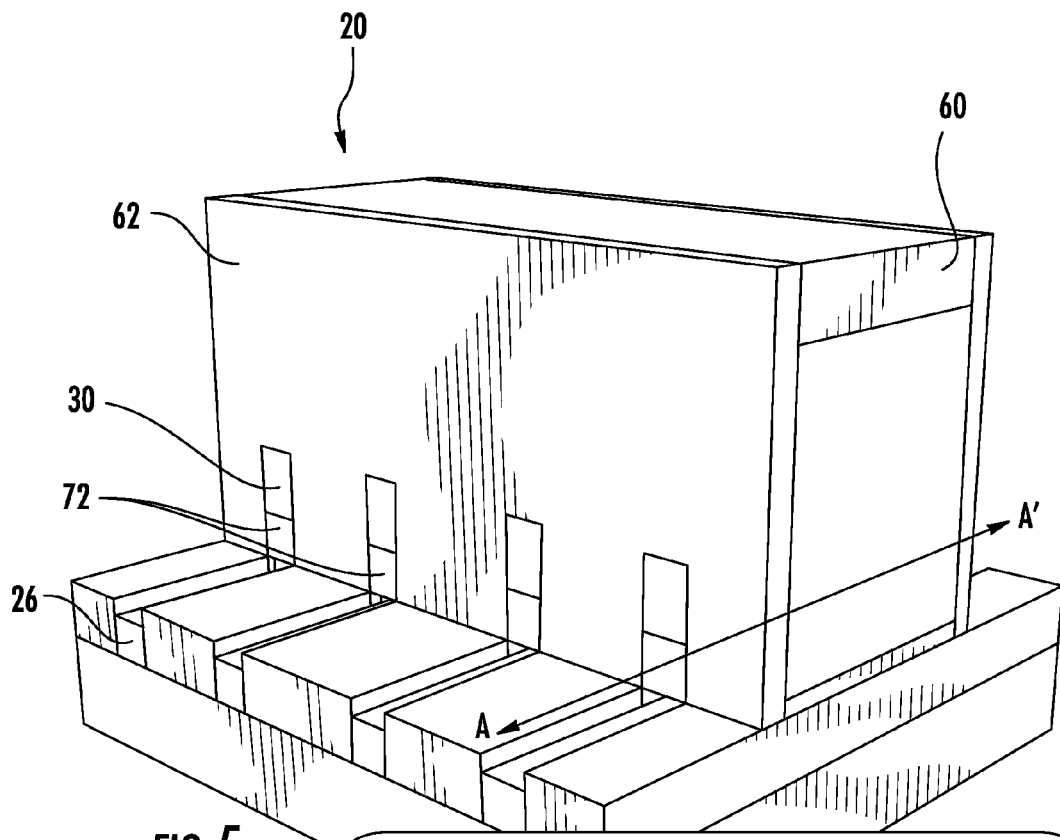
FIG. 5 is a side perspective view of the intermediate structure illustrated in FIG. 4 with the bottom openings filled with a dielectric material.

The bottom openings 70 are then filled with a dielectric material 72 at Block 208 and as illustrated in FIG. 5. The dielectric material 72 is aligned with the sidewall spacers 62. The dielectric material 72 is silicon dioxide or silicon oxide, for example. The second semiconductor fin portions 30 may thus be characterized as sacrificial fin portions since they are replaced with the dielectric material 72.

Figure 6:
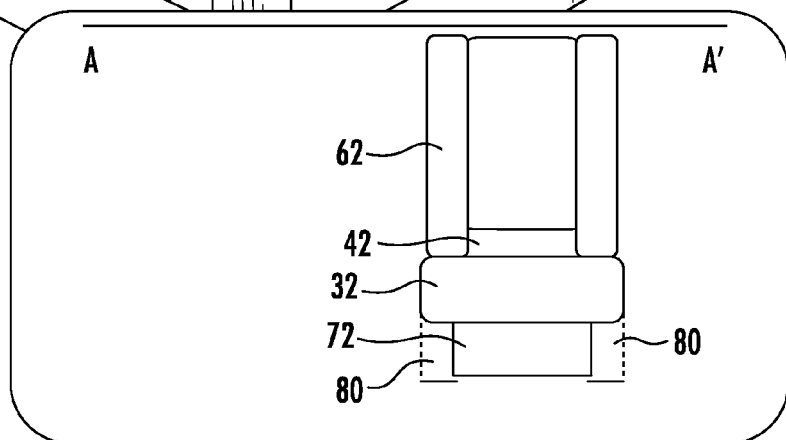
FIG. 6 is a partial cross-sectional side view of the dummy gate illustrated in FIG. 5 taken along line AA' after an anisotropic wet etching is performed to create recesses adjacent the filled bottom openings.

Before source and drain regions can be formed, the dielectric material 72 needs to be protected. To protect the dielectric material 72, an anisotropic wet etching is performed to create a recess 80 as illustrated in FIG. 6 by a partial cross-sectional side view of the dummy gate 40 taken along line AA' in FIG. 5.

Figure 7:
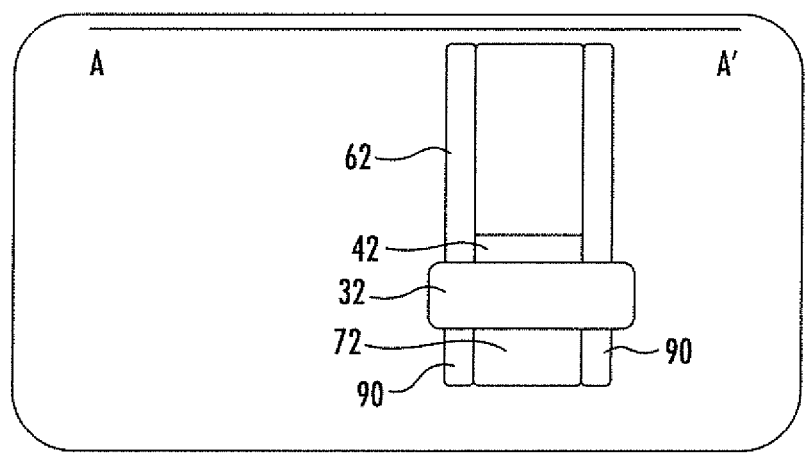
FIG. 7 is a partial cross-sectional side view of the dummy gate illustrated in FIGS. 5 and 6 taken along line AA' with sidewall spacers in the recesses.

After the recesses 80 are formed, sidewalls spacers 90 are then formed in the recesses as illustrated in FIG. 7 by a partial cross-sectional side view of the dummy gate 40 taken along line AA' in FIG. 5. The sidewall spacers 90 are silicon nitride, for example.

Figure 8:
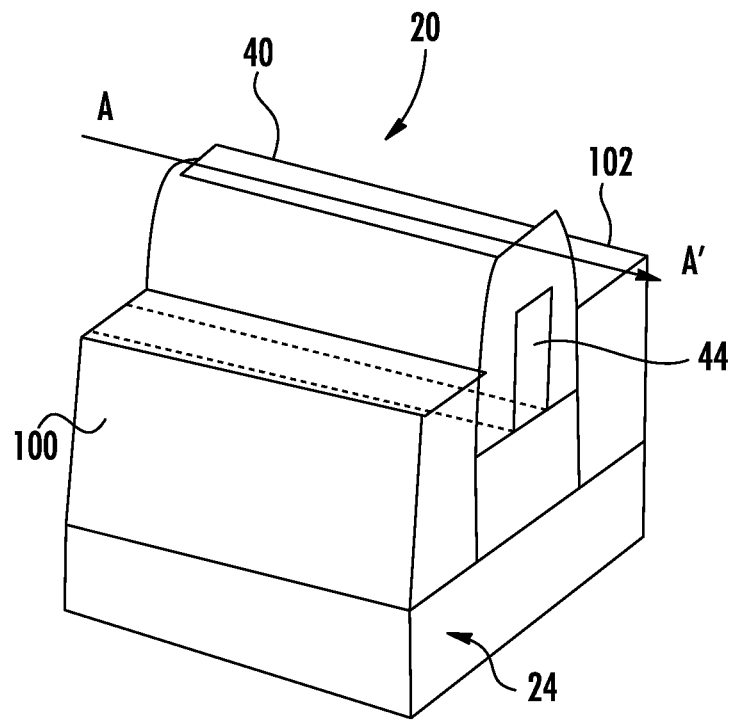
FIG. 8 is a side perspective view of the intermediate structure illustrated in FIG. 5 with source and drain regions.
Figure 9:
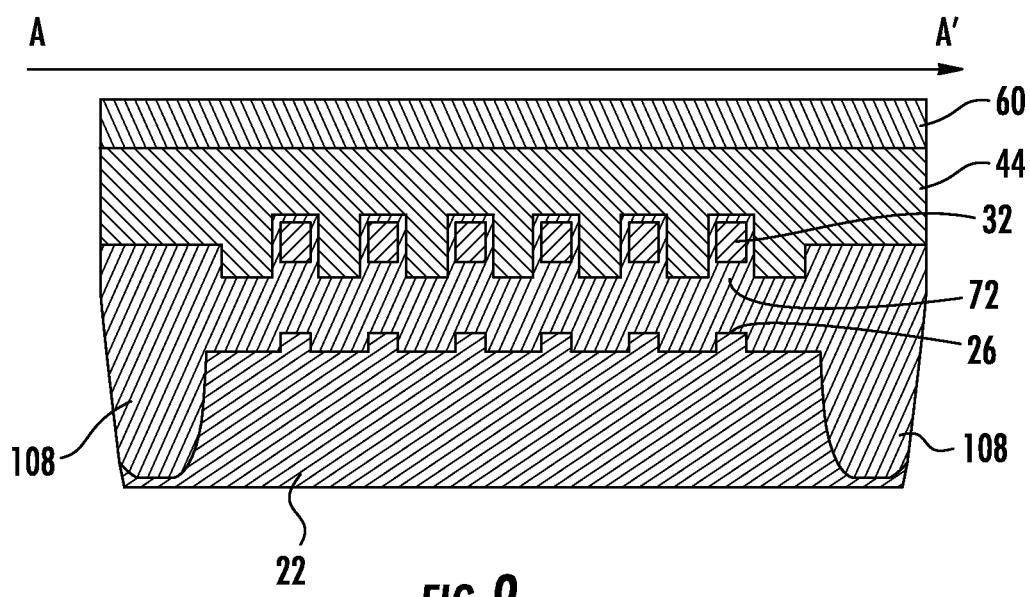
FIG. 9 is cross-sectional side view of the intermediate structure illustrated in FIG. 8 taken along line AA'.

Source and drain regions 100, 102 are formed on opposite sides of the dummy gate 40 at Block 210, and as illustrated in FIG. 8. The source and drain regions 100, 102 are raised source and drain regions. A selective epitaxial growth/deposition process is used to form the raised source and drain regions 100, 102. The raised source/drain regions typically comprise epitaxially grown silicon, for example. A cross-sectional side view taken along line AA' is illustrated in FIG. 9. Trenches 108 are also formed in the first semiconductor layer, such as during a shallow trench isolation (STI) process.

Figure 10:
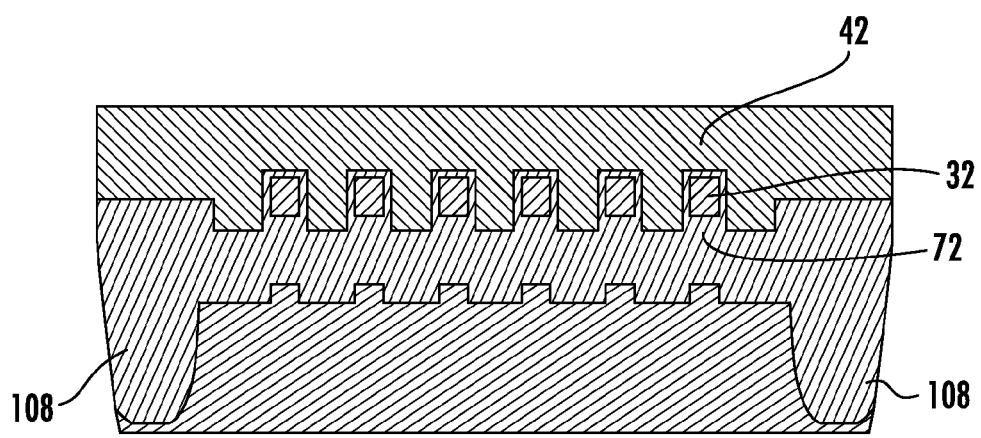
FIG. 10 is cross-sectional side view of the intermediate structure illustrated in FIG. 9 with the polysilicon removed from the dummy gate.
Figure 11:
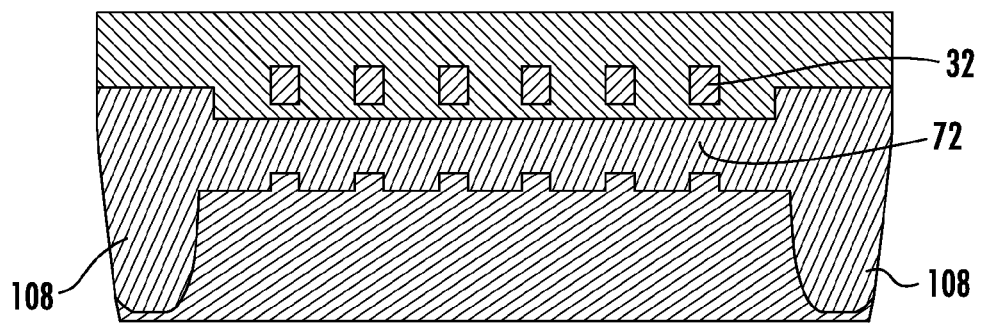
FIG. 11 is cross-sectional side view of the intermediate structure illustrated in FIG. 10 with the dielectric material from the dummy gate and a portion of the dielectric material in the bottom openings removed so that all sides of the top first semiconductor fin portions are exposed.
Figure 12:
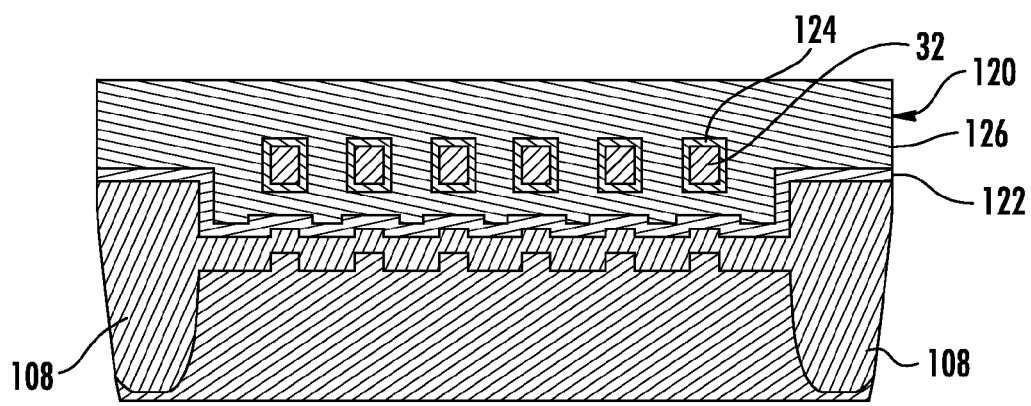
FIG. 12 is cross-sectional side view of the intermediate structure illustrated in FIG. 11 with a gate around each respective top first semiconductor fin portion.

The dummy gate 40 and a portion of the dielectric material 72 in the bottom openings 70 are removed at Block 212 so that all sides of the top first semiconductor fin portions 32 are exposed. More particularly, the dummy gate hard mask 60 and the polysilicon 44 from the dummy gate 40 is first removed, as illustrated in FIG. 10. Next, the dielectric material 42 from the dummy gate 40 and a portion of the dielectric material 72 in the bottom openings 70 are removed using a hydrofluoric acid (HF) etch, as illustrated in FIG. 11. Other chemicals may be sued to remove the dielectric material as long as the material forming the top first semiconductor fin portions 32 is not damaged. A gate 120 is formed around each respective top first semiconductor fin portion 32 at Block 214, and as illustrated in FIG. 12. The gate 120 includes a dielectric layers 122, 124 and a polysilicon layer 126 thereover. The method ends at Block 216.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

That which is claimed is:

1. A method of making a semiconductor device comprising:
    forming an intermediate structure comprising
        an intermediate dielectric layer on a first semiconductor layer,
        a plurality of bottom first semiconductor fin portions above the first semiconductor layer and within the intermediate dielectric layer,
        a plurality of second semiconductor fin portions above the first semiconductor layer and extending from respective ones of the plurality of bottom first semiconductor fin portions, with a bottom surface of each second semiconductor fin being recessed within the intermediate dielectric layer,
        a plurality of top first semiconductor fin portions extending from respective ones of the plurality of second semiconductor fin portions,
        the plurality of second semiconductor fin portions being selectively etchable with respect to the plurality of top first semiconductor fin portions, and
        a dummy gate on the plurality of top first semiconductor fin portions and the intermediate dielectric layer;
    selectively etching the plurality of second semiconductor fin portions to define a plurality of bottom openings under respective ones of the plurality of top first semiconductor fin portions; and
    filling the plurality of bottom openings with a dielectric material.

2. The method according to claim 1 wherein the first semiconductor layer comprises a first semiconductor bulk wafer.

3. The method according to claim 1 wherein forming an upper surface of the intermediate dielectric layer is above the bottom surface each second semiconductor fin portion.

4. The method according to claim 1 further comprising forming source and drain regions adjacent the dummy gate.

5. The method according to claim 4 wherein the source and drain regions comprise raised source and drain regions.

6. The method according to claim 1 wherein the dummy gate comprises an oxide layer and a polysilicon layer thereover; and further comprising removing the polysilicon layer.

7. The method according to claim 6 further comprising selectively removing the oxide layer from the dummy gate and a portion of the dielectric material in the plurality of bottom openings so that all sides of the plurality of top first semiconductor fin portions are exposed.

8. The method according to claim 7 further comprising forming a gate around each respective top first semiconductor fin portion.

9. The method according to claim 1 wherein the first semiconductor layer comprises silicon, the plurality of second semiconductor fin portions comprises silicon germanium, and the plurality of bottom and top first semiconductor fin portions comprises silicon.

10. A method of making a semiconductor device comprising:
    forming an intermediate structure comprising
        an intermediate dielectric layer on a first semiconductor layer,
        a plurality of bottom first silicon fin portions above the first semiconductor layer and within the intermediate dielectric layer,
        a plurality of second silicon germanium fin portions extending from respective ones of the plurality of bottom first silicon fin portions, with a bottom surface of each second silicon germanium fin being recessed within the intermediate dielectric layer,
        a plurality of top first silicon fin portions extending from respective ones of the second silicon germanium fin portions,
        the plurality of second silicon germanium fin portions being selectively etchable with respect to the plurality of top first silicon fin portions, and
        a dummy gate on the plurality of top first silicon fin portions and the intermediate dielectric layer;
    selectively etching the plurality of second silicon germanium fin portions to define a plurality of bottom openings under respective ones of the plurality of top first silicon fin portions; and
    filling the plurality of bottom openings with an oxide material.

11. The method according to claim 10 wherein forming the intermediate structure further comprises forming an intermediate oxide layer on the first silicon layer before forming the dummy gate, with an upper surface thereof being adjacent the plurality of second silicon germanium fin portions.

12. The method according to claim 10 further comprising forming source and drain regions adjacent the dummy gate.

13. The method according to claim 12 wherein the source and drain regions comprise raised source and drain regions.

14. The method according to claim 10 wherein the dummy gate comprises an oxide layer and a polysilicon layer thereover; and further comprising removing the polysilicon layer.

15. The method according to claim 14 further comprising selectively removing the oxide layer from the dummy gate and a portion of the oxide material in the plurality of bottom openings so that all sides of the plurality of top first silicon fin portions are exposed.

16. The method according to claim 15 further comprising forming a gate around each respective top first silicon fin portion.

17. A method of making a semiconductor device comprising:
    forming an intermediate structure comprising
        an intermediate dielectric layer on a first semiconductor layer,
        a plurality of bottom first semiconductor fin portions above the first semiconductor layer and within the intermediate dielectric layer,
        a plurality of second semiconductor fin portions above the first semiconductor layer and extending from respective ones of the plurality of bottom first semiconductor fin portions, with a bottom surface of each second semiconductor fin being recessed within the intermediate dielectric layer,
a plurality of top first semiconductor fin portions extending from respective ones of the plurality of second semiconductor fin portions,
the plurality of second semiconductor fin portions being selectively etchable with respect to the plurality of top first semiconductor fin portions, and
a dummy gate on the plurality of top first semiconductor fin portions and the intermediate dielectric layer;
selectively etching the plurality of second semiconductor fin portions to define a plurality of bottom openings under respective ones of the plurality of top first semiconductor fin portions;
filling the plurality of bottom openings with a dielectric material;
forming source and drain regions adjacent the dummy gate;
removing the dummy gate and a portion of the dielectric material in the plurality of bottom openings so that all sides of the plurality of top first semiconductor fin portions are exposed; and
forming a gate around each respective top first semiconductor fin portion.

18. The method according to claim 17 wherein the first semiconductor layer comprises a first semiconductor bulk wafer.

19. The method according to claim 17 wherein forming an upper surface of the intermediate dielectric layer is above the bottom surface each second semiconductor fin portion.

20. The method according to claim 17 wherein the source and drain regions comprise raised source and drain regions.

21. The method according to claim 17 wherein the first semiconductor layer comprises silicon, the plurality of second semiconductor fin portions comprises silicon germanium, and the plurality of first semiconductor fin portions comprises silicon.

* * * * *